US005737512A

United States Patent [19]
Proudfoot et al.

[11] Patent Number: 5,737,512
[45] Date of Patent: Apr. 7, 1998

[54] FAST VECTOR LOADING FOR AUTOMATIC TEST EQUIPMENT

[75] Inventors: David M. Proudfoot, Stanford; Peter A. Reichert, Thousand Oaks, both of Calif.

[73] Assignee: Teradyne, Inc., Boston, Mass.

[21] Appl. No.: 653,949

[22] Filed: May 22, 1996

[51] Int. Cl.$^6$ .............................. G06F 11/00; G01R 31/28
[52] U.S. Cl. .................................... 395/183.08; 371/27
[58] Field of Search ....................... 395/183.18, 183.01, 395/183.07, 183.08, 183.11, 183.16, 183.22; 371/27, 22.1, 24, 25.1, 26

[56] References Cited

U.S. PATENT DOCUMENTS

| | | | |
|---|---|---|---|
| 4,875,210 | 10/1989 | Russo | 371/27 |
| 4,931,723 | 6/1990 | Jeffrey | 371/22.3 |
| 4,958,346 | 9/1990 | Fujisaki | 371/21.3 |
| 5,072,178 | 12/1991 | Matasumoto | 324/158 R |
| 5,127,011 | 6/1992 | Combs | 371/27 |
| 5,165,029 | 11/1992 | Sawai | 395/425 |
| 5,225,772 | 7/1993 | Cheung | 324/158 R |
| 5,321,701 | 6/1994 | Raymond | 371/27 |
| 5,381,421 | 1/1995 | Dickol | 371/27 |
| 5,446,742 | 8/1995 | Vahabi et al. | 371/27 |
| 5,461,310 | 10/1995 | Cheung | 324/158.1 |
| 5,499,248 | 3/1996 | Behrens | 371/22.1 |
| 5,570,383 | 10/1996 | Brown et al. | 371/62 |
| 5,581,491 | 12/1996 | Biwer | 364/580 |
| 5,657,486 | 8/1997 | Czamara et al. | 395/595 |

FOREIGN PATENT DOCUMENTS 2-287270  11/1990  Japan .

OTHER PUBLICATIONS

Microsoft Press Computer Dictionary Second Edition 1994 JoAnne Woodcock–Senior Contributor.

*Primary Examiner*—Albert Decady
*Attorney, Agent, or Firm*—Edmund J. Walsh

[57] ABSTRACT

Fast loading of a vector test pattern in a semiconductor device tester. Fast loading is achieved through the use of delta coding of vectors in conjunction with a vector cache in the vector loading circuitry of the tester. In this way, the total amount of information transmitted during the loading operation is reduced. Hardware required to implement the method is minimized by using random access memory conventionally found in automatic test equipment for the vector cache.

16 Claims, 5 Drawing Sheets

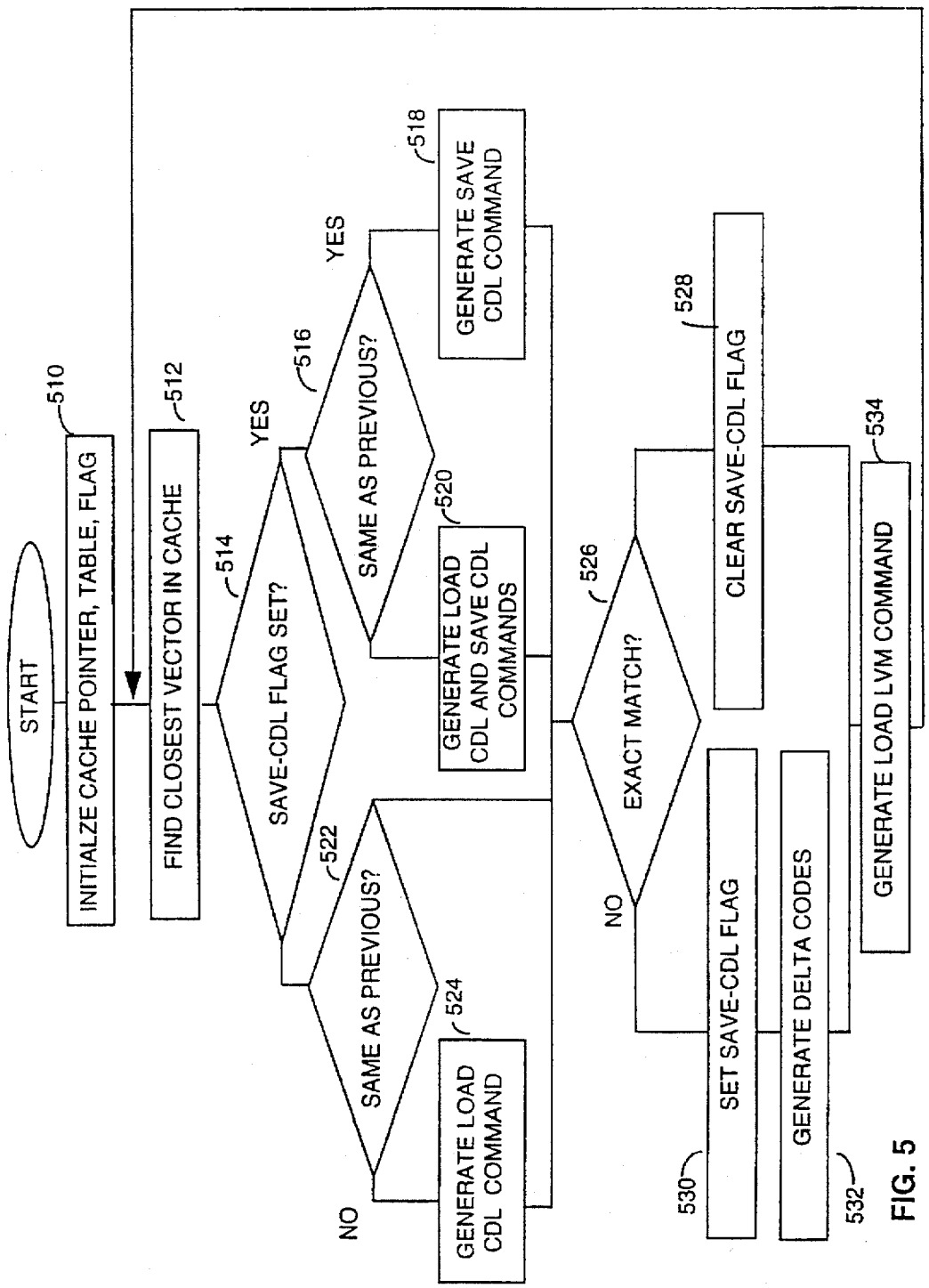

FAST VECTOR LOADING FOR AUTOMATIC TEST EQUIPMENT

This invention related generally to automatic test equipment and more specifically to quickly loading test patterns in the internal memory of automatic test equipment.

Automatic test equipment is widely used in the semiconductor manufacturing industry. Automatic test equipment, called a "tester," is used to test semiconductor components at various stages in the manufacturing process. Different tests might be conducted at different stages or for different components.

Testers are programmable, so that they can perform the different tests required. A test "pattern," consists of a series of "vectors." Each vector specifies the signals that are to be applied to the leads of a semiconductor device under test ("DUT"). The vector also specifies the signals that are to be expected from the leads of the DUT. The test pattern is stored in memory in the tester and is read out, one vector per cycle. The data values are applied to the DUT and the responses are compared to the expected responses in the vector.

In any cycle, the data provided to or read from each lead of the DUT might change. Thus, the tester must independently generate and measure signals for each lead of the DUT. To do this, the tester has multiple "channels" or "pin electronics." Each copy of the pin electronics, usually referred to as just a "pin", is connected to one lead of the DUT. Based on information contained in the vector, each pin drives a signal to the lead or measures a signal at the lead and compares it to an expected value.

The amount of data needed to specify a test pattern is very large. Each vector contains control information for each pin. Multiple bits are needed to convey whether the pin is to drive or to receive data and to describe what data values should be driven or read. A typical tester might contain hundreds of pins, but testers with thousands of pins are not unusual. Each test pattern might require tens of millions of cycles to execute. Overall, billions of bits of data are typically used to code a test pattern.

Mass storage devices, such as tapes and disks, are widely used to store such data. However, they can not be used within a tester because the access times for mass storage devices are too long. The tester must provide a full vector of data every cycle, which could as short as a few nanoseconds. Therefore, the tester includes a large amount of volatile memory. The test patterns are stored in mass storage devices and then loaded into the memory in the tester before use.

Typically, a tester is connected to a workstation. The workstation includes a mass storage device. Before a test is run, the workstation transfers the test pattern from the mass storage to the tester. In many instances, data in a mass storage device is stored in a compressed format. The work station decompresses the information before it is sent to the tester. Inside the tester, load control circuitry loads the test pattern into memory.

The process of loading billions of bits of data into memory can be very slow. Load times of fifteen to twenty minutes are not uncommon. Long load times are undesirable because the tester is not in use during the load time. Whenever equipment can not be used in a manufacturing process, it potentially decreases throughput of the manufacturing operation, which is very undesirable.

Various techniques are used to increase the speed of the loading process. In general, the speed of the loading process is limited by the rate at which data can be transferred from the workstation to the tester. One way which might increase the rate at which vectors are loaded is to increase the data rate of the connection between the workstation and the tester. For example, a fiber optic link might be used instead of conventional twisted pair bus. In some instances, increasing the data rate of the link alone will not increase the loading speed. If there is a bottleneck in the workstation, either in retrieving data from a mass storage device or processing the data, the speed of the workstation will also have to be increased to have an impact on the load time.

An alternative way to increase the speed is to reduce the amount of information transmitted over the link by sending partially compressed data to the tester. Because the tester generally has less sophisticated data processing capabilities than the work station, the full decompression is not performed by the tester. Rather, compressed data on the mass storage device is partially decompressed by the work station. The resulting data has more bits than are stored on the mass storage device, but has fewer bits than are needed to fill the nonvolatile memory on the tester.

FIG. 1 illustrates a tester equipped for receiving partially decompressed data which is still compressed with a method called delta coding. Tester 110 is shown connected to a DUT 112. Numerous pins 114 are shown. Operation of tester 110 is controlled by test control circuitry 116. A test pattern stored in LVM memory 118 is read by test control circuitry 116, which sends the appropriate control signals to each of the pins 114. Test control circuitry 116 also reports results of the test to workstation 128.

Workstation 128 is connected to tester 110. Workstation 128 provides an operator interface and controls the loading of the test pattern into tester 110. Workstation 128 has associated with it mass storage device 130, which stores the test pattern.

To load a test pattern, workstation 128 reads the test pattern from mass storage device 130. Workstation 128 partially decompresses the information, leaving it in its delta coded form. Workstation 128 then sends data about each vector to be stored in LVM 118. However, the data sent from workstation 128 to tester 110 for each vector contains information only about the pins which are different than in the previous vector.

To reduce the load times, the pins are organized into groups and control information for a group at a time is transmitted. Ideally, the groups are selected to contain pins that often require the same control information so that control information for multiple pins can be provided, but the data is transmitted over the link between workstation 128 and tester 110 once. Some groups contain only a single pin. There is one such group for each pin. These groups allow any pin to be accessed and allow any pattern of values to be specified.

Because there might be several pins or groups of pins that differ from one vector to the next, multiple data values might need to be sent to tester 110 in order to fully specify the differences between one vector and the next. In the load process, data for one vector to be stored in LVM memory 118 is built up in CDL latch 122. Once the data for one vector is built up in CDL latch 122, it is transferred to the next location in LVM memory 118.

CDL latch 122 contains a location for each pin. Various messages are sent by workstation 128 to indicate what data is to be written into each of these locations. The messages include a pin index, indicating which pins should receive the data in that message.

Once a vector is written to LVM 118, the value of that vector is still contained in CDL latch 122. The messages specifying the next vector specify which locations in the CDL latch 122 should be changed, and the new values for these locations. Once these locations are changed, CDL latch 122 contains the value of the next vector.

Load control circuitry 126 receives the messages from workstation 128. Load control circuitry 126 provides the data portion of the message to the data input of CDL 122. The pin index portion of the message is provided to pin index key, or "PIK," 124. PIK 124 is a memory used as a decoder. The memory is loaded with information indicating which pins have been assigned to each pin group. PIK 124 outputs a control line for each location in CDL 122 which enables that location for storing data. Thus, CDL 122 stores the data in each pin belonging to the group associated with the pin index in the message.

The data portion of the message might include a single data value. This data value would then be provided to CDL 122 for each pin in the group. A message with the same data for every pin in a group is called a "group same" message. Signaling bits in the message indicate that it is a group same message and specify which group of pins is to receive the data value.

An alternative form of coding has been suggested. The data portion of the message might include one value for every pin in the group. Such a message is called a "group different" message. Signaling bits in the message indicate that it is group different message and specify which group of pins is to receive one of the data values in the message.

A hybrid approach might also be used. The message might include some control bits that are common to all of the pins in a group and control bits that differ. Load control 126 constructs the appropriate control value for each pin in the group and sends those values to CDL 122. Such a message is called a "group numeric" message and is indicated by signaling bits in the message.

Writing one vector into LVM 118 typically requires a series of messages. Workstation 128 sends messages until CDL 122 stores the required data for every pin. At that point, workstation 128 sends another message indicating that the data transfer is complete. Load control circuitry 126 then transfers the information in CDL latch 122 to LVM memory 118. The process then repeats until all of the vectors in the pattern have been transferred to LVM memory 118.

The required sequence of messages to write one vector into LVM memory 118 is determined in advance as part of the process known as "compiling" the vector file stored in mass storage device 130.

Tester 110 also includes a separate memory, SVM memory 120. SVM memory 120 provides a cost effective way to have flexible execution of vectors. Because testers require a large amount of high speed memories, it would be very expensive to have all of the vector memory to be random access memory. Rather, LVM memory 118, which represents most of the memory, is sequential access memory. Sequential access memory is memory that has a shorter access time when addresses within the memory are addressed in sequence rather than when they are accessed in a random order.

SVM memory 120 is random access memory. However, it is much smaller than LVM memory 118. LVM memory 118 typically stores around 16M vectors. SVM memory 120 typically stores around 1K vectors. Therefore, the higher cost does not significantly impact the overall cost of the tester.

Those portions of a test pattern which can be executed sequentially are stored in LVM memory 118. Those portions of the test pattern which require non-sequential execution, such as branches, jumps and subroutines, are stored in SVM memory 120. Whenever a nonsequential portion of the test pattern is to be executed, test control circuit 116 pauses retrieving vectors from LVM 118 and begins retrieving vectors from SVM 120. When the non-sequential portion of the test pattern has been executed, test control circuit 116 resumes retrieving vectors from LVM 118.

SVM memory 120 is not loaded through load control circuit 126. Rather, the vectors to be stored in SVM 120 are stored in LVM 118. Before, or even during, execution of a test sequence, vectors are transferred from LVM 118 to SVM 120.

Alternative techniques for loading vectors into the tester 110 have been used. For example, it is possible that for some test patterns the total amount of information sent between the workstation and the tester can be reduced by transmitting the data by "pin-slice." A pin-slice is a sequence of values for one pin while a vector is one value for all of the pins.

However, regardless of the loading technique, it would be highly desirable to reduce the total load time to the greatest extent possible.

SUMMARY OF THE INVENTION

With the foregoing background in mind, it is an object of the invention to reduce the time required to load a test pattern into the memory of a tester.

It is also an object to provide for reduced load time without requiring significant additional hardware in the tester.

The foregoing and other objects are achieved in a tester having a load control which keeps a vector cache. For each new vector loaded into memory, one of the vectors in the cache is selected as the starting point. Differences between the selected vector and the desired vector are transmitted to the load control circuit, which constructs a new vector. That vector is loaded into memory in the tester.

In one embodiment, each new vector is also loaded into the cache. In an alternative embodiment, only predetermined new vectors are loaded into the cache.

In a preferred embodiment, the vector cache is implemented using memory already present in the tester for random access of test vectors during test execution.

BRIEF DESCRIPTION OF THE DRAWINGS

The invention will be better understood by reference to the following more detailed description and accompanying drawings in which

FIG. 5 is a flow chart showing an alternative embodiment of the compilation process.

DESCRIPTION OF THE PREFERRED EMBODIMENT

Figure 1:
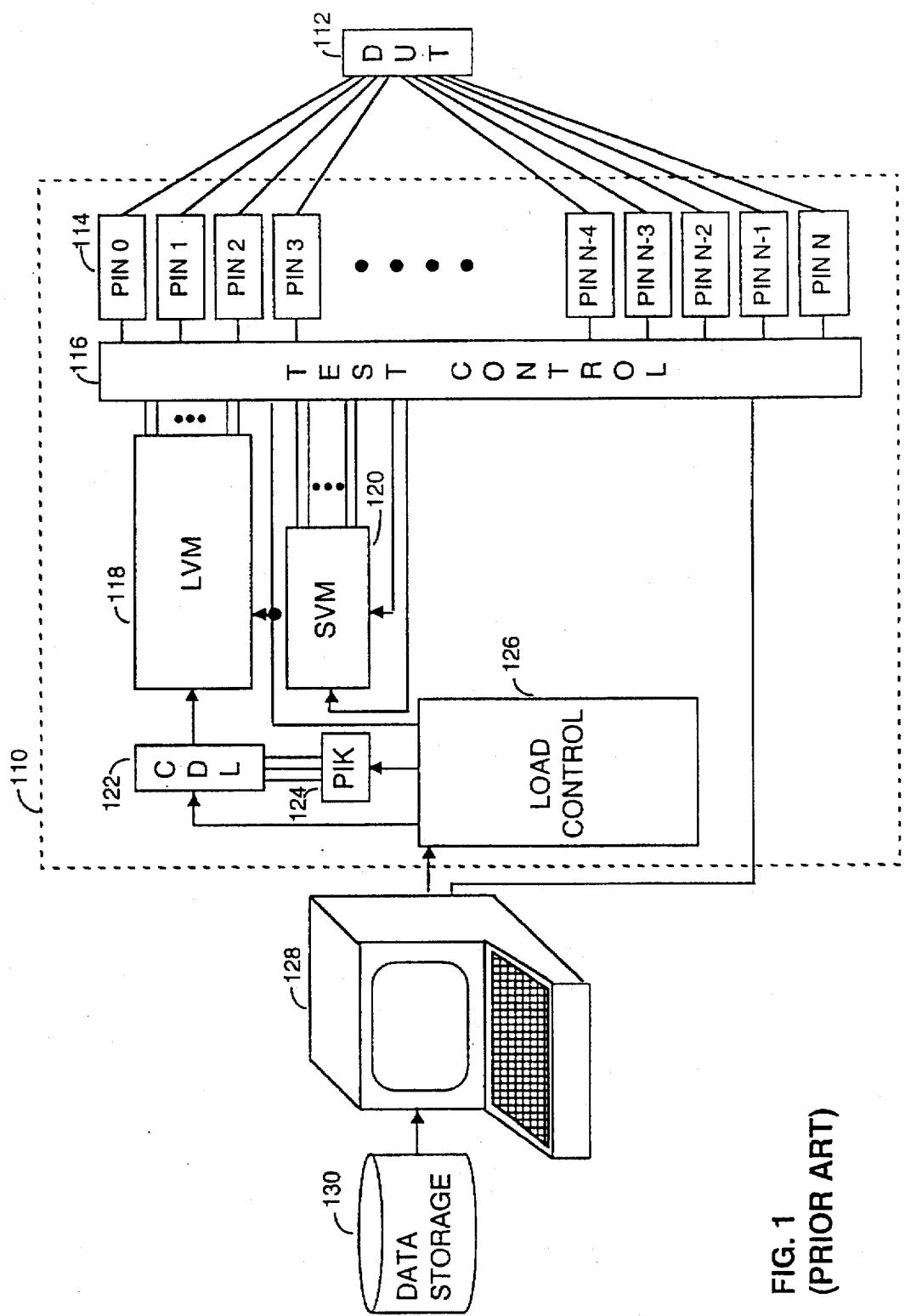
FIG. 1 is simplified schematic diagram of a prior art test system showing the vector loading circuitry.
Figure 2:
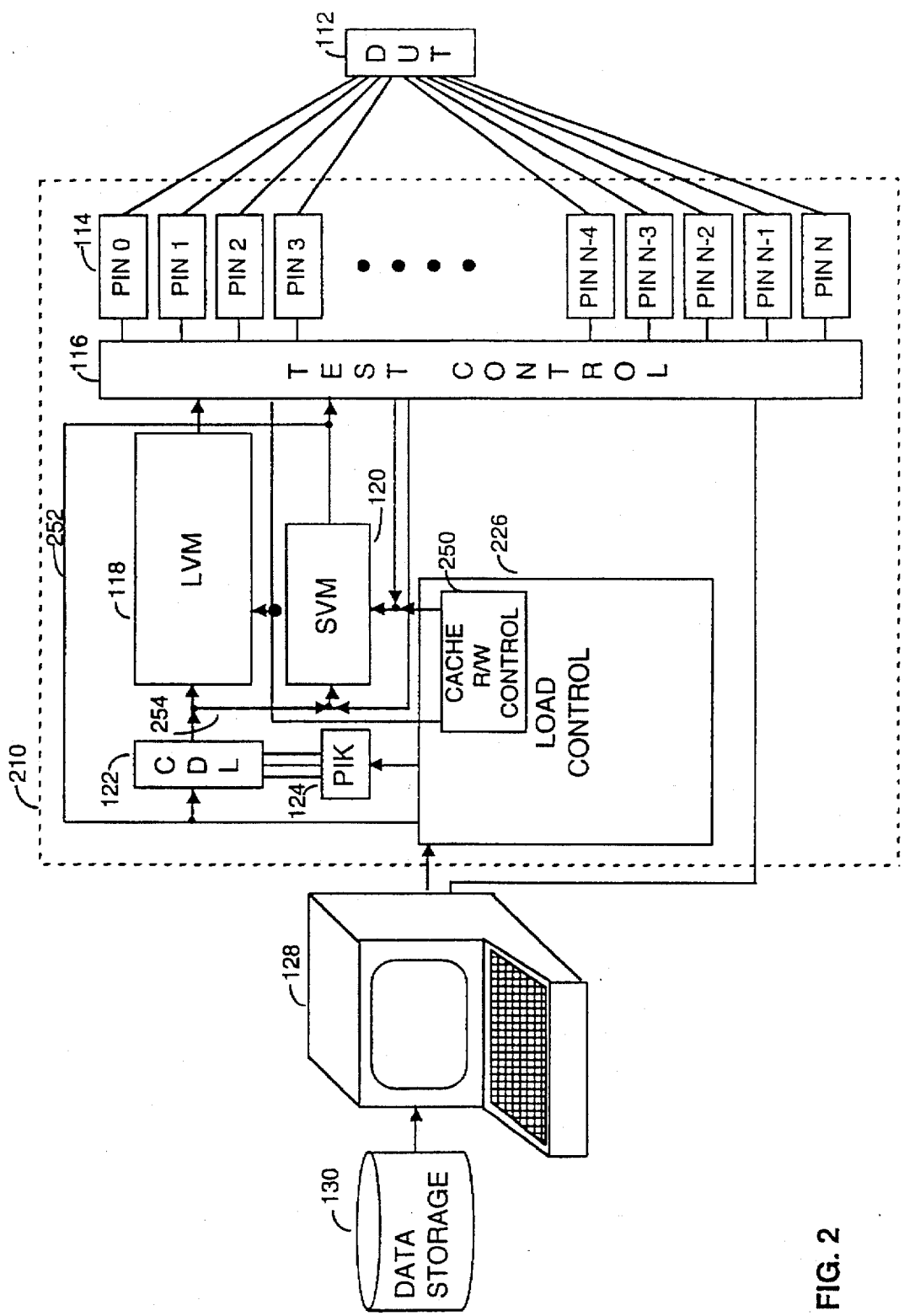
FIG. 2 is a simplified schematic diagram of a test system according to the invention showing improved vector loading circuitry.

FIG. 2 shows a tester 210 incorporating improved load circuitry 226 according to the invention. Tester 210 is similar to tester 110 of the prior art. It is connected to workstation 128, which retrieves a test pattern from mass storage 130. The test pattern is loaded into LVM memory 118.

The tester has pin circuitry 114 for numerous channels. A typical number of channels is between 256 and 1,024. Test control circuitry 116 retrieves vectors from LVM memory 118 and SVM memory 120 and, in accordance with the information in those vectors, generates appropriate signals to pin circuitry 114.

Tester 210 differs from prior art tester 110 in that load control circuitry 226 has been enhanced to use SVM memory 120 as a vector cache during loading. The vector cache stores several vectors previously loaded into LVM memory 118. When a new vector is to be transferred to LVM memory 118, one of the vectors in the cache is loaded into CDL latch 122. The most similar vector in the cache is selected for loading into CDL latch 122.

Instructions are required to be sent by workstation 128 to load control circuit 226 to specify which of the vectors in the cache should be transferred to CDL latch 122. However, we have discovered that the total amount of information which needs to be transmitted by workstation 128 is actually reduced through the use of a vector cache. The savings comes about because, on average, one of the vectors in the cache will be more similar to the word that needs to be written into LVM memory 118 than the prior vector in CDL latch 122. Because delta coding is used to specify the vector, fewer differences require less information to be transmitted.

The number of vectors stored in the vector cache influences the amount of information which must be transmitted to specify a new vector. Larger caches require less information to be transmitted while loading a test pattern. We have discovered that a cache of as few as 16 vectors can significantly decrease load time. Larger caches provide better load times.

However, the size of the cache also influences the amount of time it takes to compile a test pattern. When a cache is used, it is necessary, when the pattern is being compiled, to determine which of the vectors in the cache should be loaded into CDL latch 122. This determination requires that each vector to be loaded must be compared to each vector which will be in the cache at the time that vector is loaded. We have found that a vector cache larger than 1,024 vectors leads to compilations which are very long.

Further, for larger caches, more bits of information must be sent by workstation 128 to specify which vector in the cache should be used when loading each vector. In general, the data link between workstation 128 and load control circuit 226 is a data bus which handles fixed length words. If the number of bits needed to specify a vector in the cache increases to more than can fit in a word, an extra word is required to describe a vector. Thus, increasing the cache too much might actually decrease the transfer rate.

Preferably, the cache will hold between 16 and 1,024 vectors. In a preferred embodiment, the cache holds 1,024 vectors.

In the preferred embodiment shown in FIG. 2, the cache is implemented using SVM memory 120. As in the prior art SVM memory 120 is random access memory with 1,024 locations. Thus, the cache fits within SVM memory 120 and does not require that additional memory be added to tester 210. The cache can therefore be simply implemented by adding a few control functions to load control circuitry 226.

In particular, tester 210 includes a data path from the output of SVM memory 120 to the data input of CDL latch 122. In this way, a vector stored in the cache can be loaded into CDL latch 122. Also, the address input to SVM memory 120 can be generated by cache read/write control circuitry 250 as well as by test control circuitry 116. During vector loading when SVM memory 120 is used to implement a cache, the addresses come from cache read/write control 250. During a test, the address inputs to SVM 120 come from test control circuitry 116.

In addition, the output of CDL latch 122 must be routed to the data input of SVM memory 120 in addition to the data input of LVM memory 118. This connection allows vectors to be stored in the cache.

In essence, the preferred embodiment of the invention makes use of SVM memory 120 in different ways at different times. It is used as a cache during vector loading prior to test execution. During test execution, it is used to execute non-sequential vectors. Various circuit techniques could be used to allow a memory to be used for different functions at different times. For example, if the data inputs and outputs are connected to a bus, the bus can be routed to the different circuits that need to use the data from the memory. Those components are controlled to only read data from the bus at the appropriate times. A bus structure could also be used to allow SVM memory 120 to derive address inputs from different sources at different times. As an alternative, a multiplexer can be used at the address input to SVM memory 120 to ensure that an address is provided from the correct source.

Figure 3:
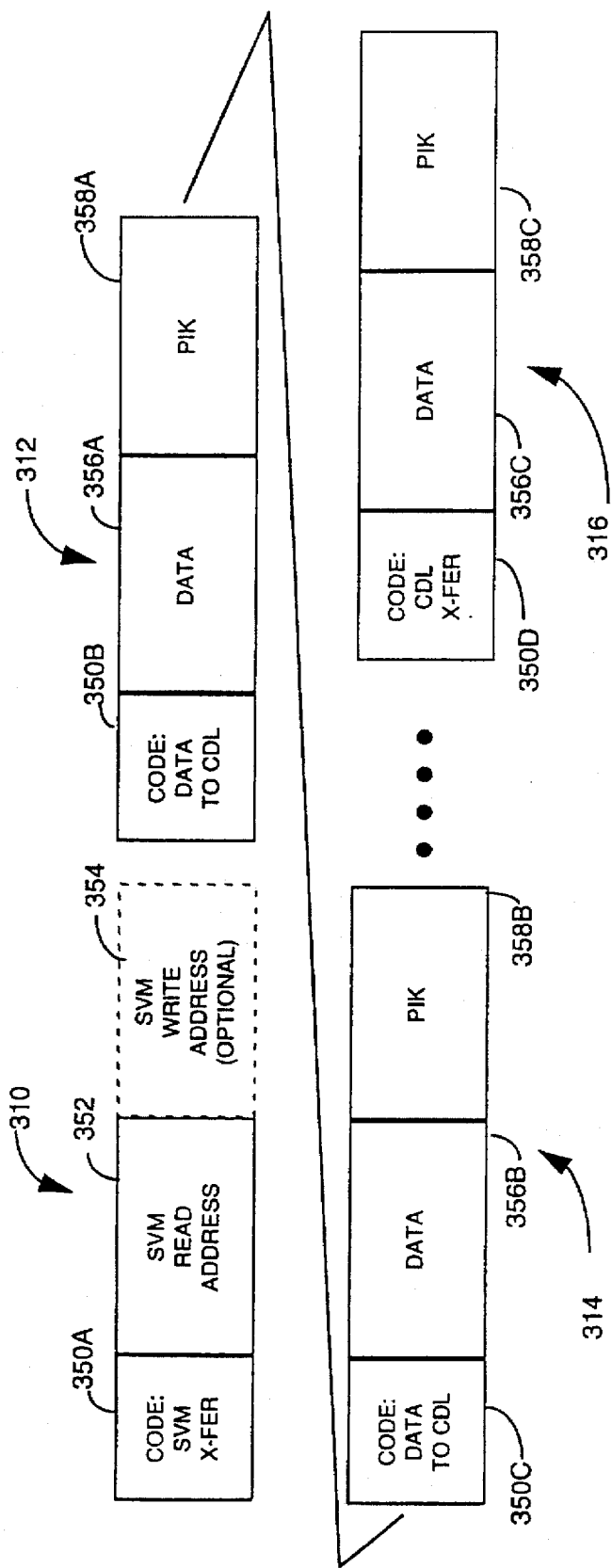
FIG. 3 is a diagram showing a stream of messages used for transmitting a vector between the workstation and the tester of FIG. 2.

The operation of tester 210 might be better understood by reference to FIG. 3, which shows the stream of messages to load one vector into LVM memory 118. Message 310 starts with a code field 350A. The value in code field 350A indicates that message 310 is the first message in the process of loading a vector and that a vector from SVM should be loaded into CDL latch 122. Load control circuitry 226 decodes this message and generates the appropriate control signals to cause a transfer from SVM memory 120 to CDL latch 122.

Address field 352 in message 310 provides the address of the vector in SVM memory 120 to transfer to CDL latch 122. Cache read/write control 250 applies this address to SVM memory 120.

Message 310 optionally contains SVM write address field 354. Write address field 354 specifies the address in SVM memory 120 where the prior vector is to be stored. When message 310 is received by load control circuitry 226, CDL latch 122 contains the vector previously loaded into LVM memory 118. This value is transferred to the address in SVM given by address field 354.

In a preferred embodiment, no write address is specified. Rather, the prior vector is stored in the next address in SVM memory 120. When the last address is reached in SVM memory 120, the next address used is the first address, writing over the vector previously stored in that location. The next write address in SVM memory 120 can therefore be computed by cache read/write control 250.

It is not necessary, though, that every vector be stored in the cache. For example, if the cache stores 1,024 vectors and a particular vector will not be used before 1,024 other vectors are written to the cache, that vector will be overwritten in the cache before it is reused. Therefore, that vector need not be placed in the cache. Write address field 354 might be used to only indicate whether the vector needs to be stored in the cache. In the preferred implementation, the write address field 354 is a single bit. When the bit is set, cache read/write control circuit 250 provides the next address in sequence for SVM memory 120.

In a preferred embodiment, message 310 is transmitted over a data bus having both address and data lines (not shown). The various memory and register locations within tester 100 are assigned to addresses on this bus. Though FIG. 3 shows a separate field 350A indicating a code to transfer a value from SVM 120, a transfer from SVM can actually be indicated by the value on the address lines of the bus.

Also, field 352 need not contain an absolute address within SVM 120. In a preferred embodiment, the value in address field 353 is an offset or relative address. As described above, vectors are written into successive locations in SVM memory 120. In order to keep track of which is the next location, cache read/write control circuit 250 maintains a write pointer. The SVM read address in field 352 is actually specified as an offset from this pointer.

Message 312 is sent next. Message 312 is a delta coding message as in the prior art. It contains a code field 350B containing a value indicating that the message represents changes that should be made to the vector stored in CDL latch 122. PIK field 358A indicates which pin group should be changed. Data field 356A indicates the value to which those pins should be changed. This message might be in any one of the prior art message formats.

Message 314 is similar. It gives values for another pin group. Any number of delta coding messages are transmitted in this fashion until the required changes to the vector in CDL latch 122 are conveyed.

The final delta coding message 316 contains a code field 350D with a value signaling that the message contains the final change to the vector. Upon receipt of message 316, load control circuitry generates control signals to write the vector in CDL latch 122 into the next location in LVM memory 118. The transfer of one vector is therefore complete.

In a preferred embodiment, the code fields 350B, 350C and 350D are not actually separate from the PIK fields 358A, 358B and 358C. Rather, certain values in the PIK fields 358A, 358B and 358C are used to indicate that a data transfer is to be made. As described above, these messages are transmitted over a bus having both address and data lines. The address lines specify that the message is intended to affect CDL latch 122. Also, because the value in PIK field 358C actually indicates a transfer from CDL 122 to LVM 118 rather than a pin group, data field 356C is not used.

Load control circuitry 226 is implemented in the preferred embodiment using one or more application specific integrated circuits (ASICS) which have been programmed to perform the functions described above. Such ASICS implement a state machine which keeps track of the state of the load operation and generates the appropriate control signals based on the messages sent by workstation 128. Implementation of a state machine controller using ASICS is well known in the art.

In a preferred embodiment, the write from CDL latch 122 to SVM 120 and the read from SVM 120 happen in the same clock cycle. These operations are implemented as a "swap." However, the timing of the read and write operations is not essential to the invention.

Figure 4:
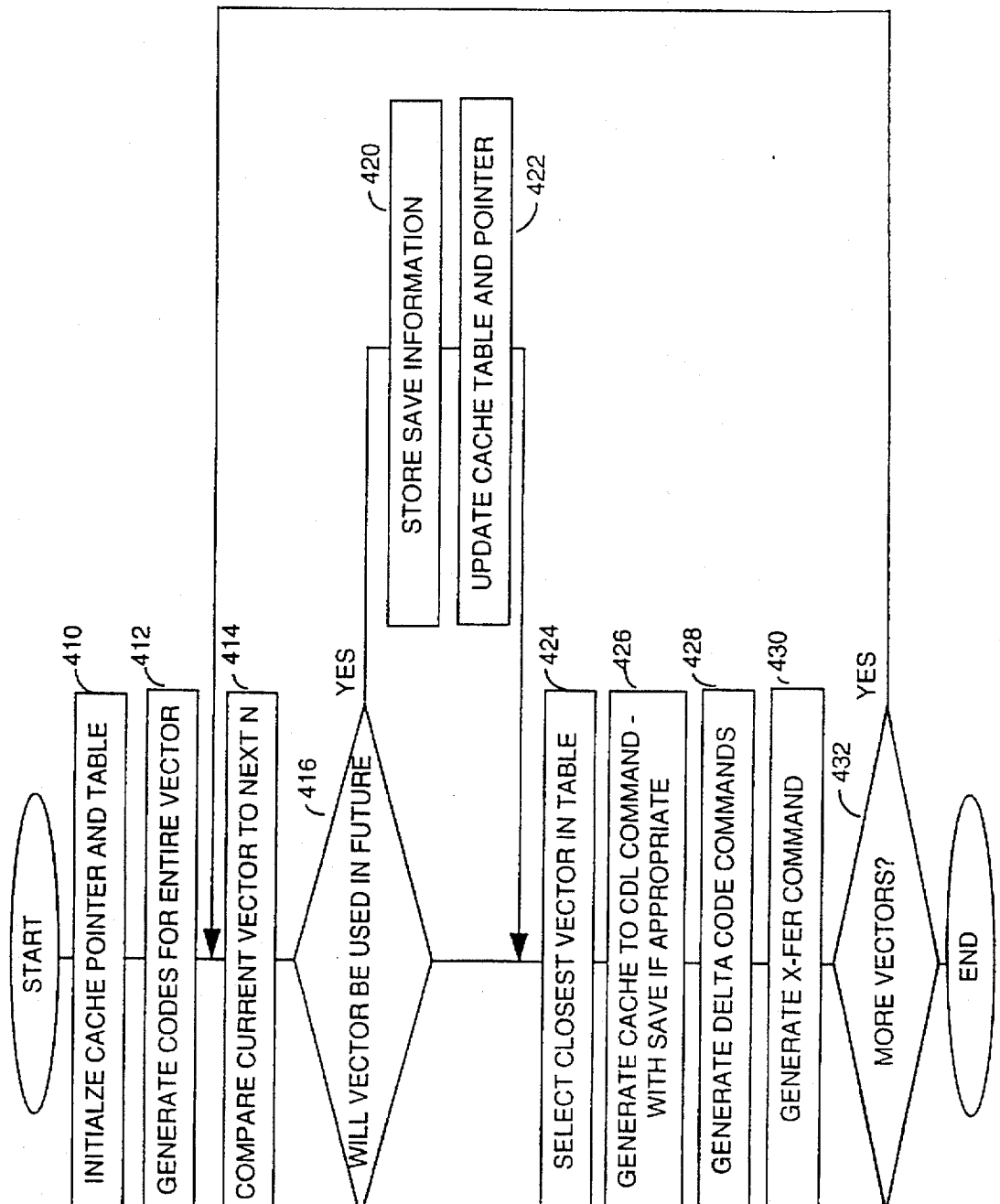
FIG. 4 is a flow chart showing the compilation process for a test pattern used in conjunction with the invention.

To operate the load process as described above, it is necessary that workstation 128 determine, at the time each vector is loaded into LVM memory 118, what information is stored in the cache. In the preferred embodiment, this information is determined in advance as part of the compilation of a test pattern, which is performed by work station 128 or on some other similar computer. FIG. 4 shows a flow chart of the portion of the compilation process that determines how each vector is coded.

At step 410, a table is set up in memory that will hold values emulating the values in the cache as each vector is loaded. As the cache contains no values when the first vector is loaded, it is initialized to be empty. A write pointer for this table is set to the first location in the table. The write pointer emulates the write pointer in cache read/write control circuit 250 (FIG. 2).

At step 412, codes for the entire vector are generated. Because step 412 first processes the first vector in the test pattern, there is no prior vector to use as the starting point. Thus, a series of messages, such as 312 and 314 are generated, with the PIK fields, such as 358A and 358B, specifying enough groups to include every pin once. This step is the same as in prior art compilation processes.

At step 414, the vector for which codes have just been generated is compared to some number, N, of future vectors in the test pattern to see if that vector is more similar to any of those vectors than vectors that will be in the cache when those vectors are processed.

To simplify processing, the number N is, in a preferred embodiment, taken to be the same as the number of vectors that the cache can hold. To further simplify processing, it is assumed that every future vector will be stored in the cache. Thus, the next vector after the current vector is compared to all N vectors in the table, which emulates the cache. The next vector is compared to only the first N−1 vectors in the table. The next vector is compared to only the first N−2 vectors in the table; the vector after that to the first N−3 vectors in the table; and so on.

Two vectors are compared by determining the number of delta coded messages that would need to be sent to specify the first vector if the second vector were already in CDL latch 122 (FIG. 2). Fewer messages implies closer similarity.

At step 416, a decision is made based on the results of the comparison made at step 414. If the current vector is closer to any one of the next N vectors in the pattern than the vectors in the table, it will be added to the cache. Thus, processing proceeds to step 420 and 422. On the other hand, if the vectors already in the cache are closer to the next N vectors than the current vector, the current vector would never be used if it were added to the cache. In that case execution proceeds directly to step 424.

As mentioned above, step 420 is executed when the current vector is to be added to the cache. Step 420 makes a record that the vector is to be added to the cache. This record is accessed at step 424.

In step 422, the table and pointer are updated to reflect that the vector will be added to the cache. The table is updated in the same manner that the cache is updated: the vector is stored at table location pointed to by the pointer. The pointer is then incremented. If a value is already at that location of the table, it is over-written. When the pointer comes to the end of the table, it is reset to the first location in the table.

Whether or not the table is updated, execution proceeds to step 424, which represents the start of processing of the next vector in the pattern. A comparison is made between that vector and all of the vectors in the table at that time. The closest vector in the table is selected. Because the table emulates the cache, the address in the table of the selected vector is the same as the address in the cache of the closest vector.

The address of the closest vector is used as the cache read address for the message 310 (FIG. 3), which is generated at step 426. Message 310 also includes a field 354 indicating whether the prior vector in CDL latch 122 (FIG. 2) should be transferred to the cache. Field 354 is filled in if information stored at step 420 indicates that the prior vector should be stored in the cache.

Once the closest vector is identified in the table, appropriate delta coding messages are generated at step 428. The delta coding messages are generated as in the prior art. However, instead of being based on the preceding vector, they are based on the vector selected at step 424.

Once the delta coding messages are generated, execution proceeds to step 430. At step 430, a transfer command, such as message 316 (FIG. 3) is generated.

Execution the proceeds to step 432. At step 432 a check is made whether all vectors in the test pattern have been processed. Of there are no more vectors, processing is completed. If more vectors remain, execution proceeds to step 414 where the processing repeats with the next vector in the test pattern becoming the current vector.

In this way, all messages depicted in FIG. 3 are generated for every vector in the pattern. Those messages are stored in the data storage device 130 (FIG. 2). The generated messages can be stored directly or they can be stored using data compression techniques as in the prior art.

FIG. 5 shows an alternative compilation process which is less time consuming than the process in FIG. 4. At step 512, a cache pointer and cache table are initialized as described above for step 410. At step 510, a SAVE-CDL flag is also initialized by clearing it. Other initialization steps are also performed, such selecting the first vector from the pattern file being processed as the current vector.

At step 512, the current vector is compared to some number of vectors in the cache. As can be seen in FIG. 5, step 512 is within a loop. That loop is repeated once for each vector in the test pattern. The first time through the loop, the current vector is the first one.

At step 512, a vector is compared by simply counting the number of pins in the two vectors that have the same data values. The vector with the most pins having the same data values as the current vector is the closest. Selecting the vector with the most data values the same will not necessarily result in the fewest delta coded messages because the delta coded messages are generated based on the number of pin groups that are the same. However, selecting the closest vector in this fashion will often result in the fewest delta coded messages with a significantly reduced compilation time. In some instances, it will be desirable to reduce the compilation time even if the load time is not completely minimized.

At step 512, the current vector might be compared to each vector in the cache. Alternatively, comparison might be made to only some number, for example 64, of vectors in the cache.

Execution then proceeds to step 514. Step 514 is a decision block which checks whether the SAVE-CDL flag has been set. This flag is used to remember whether a vector in the CDL is the same as one already in the cache. In the initial pass, there are no vectors in the CDL and the SAVE-CDL flag is still in its cleared state. Therefore, in the first pass and in subsequent passes when the SAVE-CDL flag is cleared, execution will proceed to step 522.

Step 522 is another decision block. At step 522, a check is made whether the closest vector is the same as the previous vector. If so, there is no need to generate any command to load CDL 122. As step 522 is executed only when the SAVE-CDL flag is not set, there is also no need to generate a command to save the CDL contents in the cache. Thus, execution proceeds directly to step 526. In this case, message 310 is not generated.

When, as determined at step 522, the closest vector is not the same as the previous vector, it is necessary to generate a command to load the closest vector from the cache into CDL 122. Execution proceeds to step 524 where a message 310 is generated with the address of the closest vector identified at step 512 in field 352. As step 524 is only executed when the SAVE-CDL flag is clear, the contents of the CDL 122 are not saved, and the field 354 of that message indicates accordingly.

A complementary set of instructions are generated when the SAVE-CDL flag is set. In this case, execution proceeds to step 516, which is a decision block which determines whether the closest vector is the same as the preceding vector. If so, execution proceeds to step 518. In this circumstance, it is necessary to save the contents of the CDL 122 in the cache, but it is not necessary to load a new value in the CDL. Therefore, step 518 generates a message 310 which specifies a NULL address in field 352, indicating that no vector is loaded from the cache into the CDL. However, field 354 is set, indicating that the current value in the CDL is placed in the next address in the cache.

When the closest vector is not the same as the previous and the SAVE-CDL flag is set, it is necessary to save the value in the CDL and load in a new value. Therefore, execution proceeds to step 520. Step 520 generates a message 310 which includes in field 352 the address in the cache of the closest vector. Field 354 is also set indicating that the contents of the cache are stored in the next write location in the cache.

It will be appreciated that during the compilation process, commands are generated to be sent to tester 210 during the actual loading operation. The cache pointer and cache table in workstation 128 are updated to emulate the corresponding hardware in tester 210 as it responds to the generated commands. If necessary based on the hardware within tester 210 to send commands to alter the state of read or write pointers, those commands can also be generated as part of the compilation process.

Regardless of which path is taken as a result of steps 514, 516 and 522, execution proceeds to step 526. When execution reaches step 526, the appropriate command has been generated to load a value in CDL 122. Step 526 determines whether this value is an exact match to the current vector.

If the value in CDL 122 is not an exact match to the current vector execution proceeds to step 530. At step 530, the SAVE-CDL flag is set, indicating that the current vector should be saved in the cache. Execution then proceeds to step 532.

At step 532, messages 356A, 356B, 356C, etc. are generated to specify the required delta code commands. As in the prior art, these commands will transform the contents of the CDL into the current vector. Execution then proceeds to step 534 where command 316 to transfer the value from CDL 122 into LVM is generated.

When, as determined at step 526, the value in CDL 122 is an exact match for the current vector, no delta code commands are generated. Moreover, there is no need to save the current vector in the cache because it is the same as a vector already in the cache. Thus, execution proceeds to step 528 which clears the SAVE-CDL flag. There is no need to generate delta coding commands and execution proceeds to step 534 where message 316 is generated.

Execution then loops back to step 512 and the process is repeated with the next vector. Vectors are processed one after another until all vectors have been processed.

The stream of messages produced in the compilation process is captured, such as in an output file. The stream of messages represents the partially compressed data which is sent to tester 210 during the loading operation. If desired, this partially compressed data can be further compressed before being stored in data storage device 130.

Having described one embodiment, numerous alternative embodiments or variations might be made. For example, FIG. 3 indicates that the prior vector stored in CDL latch 122 is transferred to the cache at the same time that a vector is transferred from the cache to CDL latch 122. Various alternatives are possible. A vector might be transferred to the cache at the same time that it is transferred to the LVM memory 118.

As another variation, it is not necessary that the cache be implemented using SVM memory in the tester. While use of such memory is highly desirable because it does not require the addition of expensive memory, other memory in the tester might be used or other memory might be added to the tester for that purpose.

As a further variation, it was described that in the preferred embodiment the cache is a first-in, first-out type cache. It was also described that the cache write address might be specified for each vector to be stored in cache. This arrangement allows the length of time each vector stays in the cache to be controlled. Those vectors that are to be used by many future vectors are not written over and therefore stay in the cache for a long time. A third possibility is that a portion of SVM memory 120 might be dedicated to a first-in, first-out cache and another portion of the SVM memory 120 might be dedicated to a cache which stores a vector until it is overwritten. In this way, a vector used by many future vectors would be retained, but less frequently used vectors would be cleared from the cache after a while.

It should also be appreciated that various fields in messages were shown to indicate a way to transmit messages from workstation 128 to tester 110. The same information might be encoded in any number of ways.

Further, it should be noted that workstation 128 is, in a preferred embodiment, a workstation as sold by Sun Microsystems Computer Corporation. Any similarly powerful computer could be used as the workstation. It is not necessary that the workstation be a stand alone computer. A networked computer might be used.

Therefore, the invention should be limited only by the spirit and scope of the appended claims.

What is claimed is:

1. Automatic test equipment of the type executing a test pattern comprising a series of vectors, the test equipment being of the type which is connected to a workstation having nonvolatile memory for storing the test pattern, comprising:
   a) a memory for storing the test pattern;
   b) circuitry for executing the test pattern stored in the memory and generating test signals, the circuitry being connected to the memory;
   c) a data input port adapted for connection to the workstation; and
   d) load control circuitry, connected to the data input port and the memory, comprising
      i) a cache memory for storing a plurality of vectors, and
      ii) control logic for receiving a message from the data input port, retrieving a vector from the cache memory in response to the received message, receiving change messages from the data input port, producing a composite vector from the combination of the vector retrieved from the cache memory and the received change messages, and storing the composite vector in the memory for storing the test pattern.

2. The automatic test equipment of claim 1 wherein the cache memory comprises random access memory and the memory for storing a test pattern comprises sequential access memory.

3. The automatic test equipment of claim 1 wherein the control logic comprises:
   a) a latch having a data output connected to the memory for storing the test pattern, the latch having a plurality of locations and a plurality of enable inputs, each enabling storage of data in one of the plurality of locations, and
   b) a lookup table memory having a plurality of outputs, each coupled to the enable inputs of the latch.

4. The automatic test equipment of claim 3 having a plurality of pins and wherein each vector contains one field for each pin in a group of said pins, and wherein the number of locations in the plurality of locations in the latch equals the number of pins in the group.

5. The automatic test equipment of claim 1 wherein the control logic additionally includes means for storing the composite vector into the cache memory.

6. The automatic test equipment of claim 1 wherein the control logic additionally includes means for selectively storing the composite vector into the cache memory.

7. The automatic test equipment of claim 6 wherein the composite vector is selectively stored in response to a data value provided at the data input port.

8. A method of manufacturing a semiconductor component using the automatic test equipment of claim 1, the method comprising the steps of:
   a) operating the load control circuitry to store a test pattern in the memory for storing a test pattern; and
   b) executing the test pattern.

9. Automatic test equipment of the type executing a test pattern with a plurality of vectors, comprising:
   a) sequential access memory for storing at least a portion of the test pattern;
   b) random access memory for storing a portion of the test pattern;
   c) test control circuitry coupled to the sequential access memory and the random access memory, for executing the test pattern by executing the plurality of vectors sequentially from the sequential access memory and nonsequentially from the random access memory;
   d) a data input port; and
   e) load control circuitry means coupled to the data input port and the random access memory, comprising
      I) a cache memory for storing a plurality of vectors, and
      ii) control logic for receiving a message from the data input port, retrieving a vector from the cache memory in response to the received message, receiving change messages from the data input port, producing a composite vector from the combination of the vector retrieved from the cache memory and the received change messages, and storing the composite vector in the memory from storing the test pattern, for deriving vectors from information provided at the data input port, the load control circuitry further comprising means for using the random access memory as a vector cache during a vector loading operation.

10. The automatic test equipment of claim 9 wherein the load control circuit includes read/write control logic for the random access memory to operate the random access memory as a cache.

11. The automatic test equipment of claim 10 wherein the test control circuitry includes means to operate the random access memory as a subroutine memory.

12. The automatic test equipment of claim 9 wherein the load control circuitry includes
   a) a latch having a plurality of data fields and an enable input for each of the plurality of data fields, and
   b) a look-up memory having a plurality of outputs, each connected to one of the enable inputs of the latch.

13. The automatic test equipment of claim 12 wherein the latch further comprises a data input, the look-up memory has a data input, and the load control circuitry includes means for applying a first field of a message at the data input port to the data input of the latch and a second field of a message at the data input port to the data input of the look-up memory.

14. The automatic test equipment of claim 9 wherein the load control circuitry comprises:
   a) a latch having a plurality of independently accessible fields;
   b) means for loading into the latch, in response to a first message, a specified vector from the random access memory;
   c) means for altering, in response to a second message, selected fields in the latch; and
   d) means for storing in the sequential access memory, in response to a third message, the contents of the latch.

15. The automatic test equipment of claim 14 additionally comprising means for storing the contents of the latch in the random access memory.

16. A method of manufacturing a semiconductor component using the automatic test equipment of claim 9, the method comprising the steps of:
   a) operating the load control circuitry to load a test pattern into the sequential access memory; and
   b) executing the test pattern.

* * * * *